(12) United States Patent
Nakamura

(10) Patent No.: US 6,792,064 B2
(45) Date of Patent: Sep. 14, 2004

(54) MULTIPLE PHASE-LOCKED LOOP CIRCUIT

(75) Inventor: Satoshi Nakamura, Tokyo (JP)

(73) Assignee: NEC Electronics Corporation, Kanagawa (JP)

(*) Notice: Subject to any disclaimer, the term of this patent is extended or adjusted under 35 U.S.C. 154(b) by 272 days.

(21) Appl. No.: 10/076,345

(22) Filed: Feb. 19, 2002

(65) Prior Publication Data

US 2002/0114418 A1 Aug. 22, 2002

(30) Foreign Application Priority Data

Feb. 20, 2001 (JP) ........................................ 2001-044337

(51) Int. Cl.$^7$ ................................................ H03D 3/24
(52) U.S. Cl. ........................ 375/376; 375/375; 375/374; 327/148; 327/157; 331/DIG. 2
(58) Field of Search ................................. 375/376, 375, 375/374; 327/156, 157, 147, 148; 331/DIG. 2, 25

(56) References Cited

FOREIGN PATENT DOCUMENTS

JP         11-122102          4/1999

*Primary Examiner*—Temesghen Ghebretinsae
(74) *Attorney, Agent, or Firm*—McGinn & Gibb, PLLC

(57) ABSTRACT

A multiple phase-locked loop circuit is provided which is capable of being reliably restored from a deadlock state without disturbing normal operations. The multiple phase-locked loop circuit includes a first phase/frequency comparator to output an UP signal or first DN signal, a second phase/frequency comparator to output a second DN signal when a frequency of a first frequency-divided clock is lower than that of a second frequency-divided clock, a charge pumping circuit to cause a current to flow in or flow out, a low pass filter to smooth the current that flows in or out, a voltage controlling oscillator to change an output clock frequency based on a control voltage, a first frequency divider to generate the first frequency-divided clock by dividing a frequency of an output clock, and a second frequency divider to generate the second frequency-divided clock by dividing a frequency of a reference clock.

11 Claims, 16 Drawing Sheets

MULTIPLE PHASE-LOCKED LOOP CIRCUIT

BACKGROUND OF THE INVENTION

1. Field of the Invention

The present invention relates to a multiple phase-locked loop (PLL) circuit having a function of preventing a deadlock.

The present application claims priority of Japanese Patent Application No. 2001-044337 filed on Feb. 20, 2001 which is hereby incorporated by reference.

2. Description of the Related Art

Generally, in a conventional multiple PLL circuit, as explained in detail later, an UP signal used to increase an oscillation frequency and a DN signal used to lower the oscillation frequency are output from a phase/frequency comparator adapted to detect a difference in phase between a reference signal and a feedback signal obtained by dividing a frequency of an oscillation signal output from a voltage controlling oscillator (VCO). Then, an error signal produced based on each of pulse widths of the UP signal and DN signal is output from a charge pumping circuit. A control signal being at a level corresponding to that of the error signal is output through a low pass filter (LPF), which controls the oscillation signal output from the voltage controlling oscillator to cause the oscillation frequency to match the frequency of the reference signal, thus causing the oscillation signal to be synchronized with the reference signal.

Hereinafter, configurations and operations of the conventional multiple PLL circuit will be described by referring to FIG. 9. As shown in FIG. 9, the conventional multiple PLL circuit chiefly includes a phase/frequency comparator (PFD) 1, a charge pumping (CP) circuit 2, a low pass filter (LPF) 3, a voltage controlling oscillator (VCO) 4, and a frequency divider (DIV) 5.

The PFD 1 compares a phase or a frequency of a signal input to an input terminal S1 with a phase or a frequency of another signal input to an input terminal S2 and, if the other signal input to the input terminal S2 lags the signal input to the input terminal S1 or if the frequency of the other signal input to the input terminal S2 is lower than that of the signal to the input terminal S1, outputs an UP signal being a pulse which falls by a rise of the signal input to the input terminal S1 and rises by a rise of the other signal input to the input terminal S2, to an output terminal "u" and further, if the other signal input to the input terminal S2 leads the signal input to the input terminal S1 or if the frequency of the other signal input to the input terminal S2 is higher than that of the signal input to the input terminal S1, outputs a DN signal being a pulse which rises by a rise of the other signal input to the input terminal S2 and falls by a rise of the signal input to the input terminal S1.

The CP circuit 2, by generating an error signal to be output from an output terminal "e" in response to an UP signal input to an input terminal L1 and in response to a DN signal input to an input terminal L2, operates so as to cause a current to flow out from a power source through the output terminal "e" or a current to flow to a ground from the output terminal "e". The LPF 3, by removing a high frequency component based on the flow-in and flow-out of currents contained in the error signal fed from the charge pumping circuit 2, generates a smoothed control signal. The VCO 4 generates an output clock signal a frequency of which changes to be high or low depending on whether a control voltage is large or small. The DIV 5 outputs a frequency-divided clock signal div.CLK obtained by dividing a frequency of an output clock signal VCO.CLK output from the VCO 4.

The conventional PFD 1, as shown in FIG. 10, includes inverters 1A, 1B, 1M, 1N, 1P, 1R to 1T, 1V to 1Y, NAND gates 1C to 1H, 1J, 1K, NOR gates 1L, 1Q, and 1U. Of them, the NAND gates 1D and 1E make up a first flip-flop and the NAND gates 1G and 1H make up a second flip-flop. Moreover, the NOR gate 1Q and the inverters 1R and 1S make up a reset circuit.

A reference clock signal ref.CLK input to the input terminal S1 is fed through the inverter 1A to the NAND gate 1C. The NAND gate 1C computes the NAND of the reference clock signal ref.CLK with a previous output signal and outputs a result of the computation to the NAND gate 1F. The NAND gate 1F computes the NAND of an output of the first flip-flop with an output from the NAND gate 1C and produces a signal 1a from a result of the computation. Moreover, the frequency-divided clock signal div.CLK output from the DIV 5 and input to the input terminal S2 is fed through the inverter 1B to the NAND gate 1J. The NAND gate 1J computes the NAND of the frequency-divided clock signal div.CLK with a previous output signal and outputs a result of the computation to the NAND gate 1K. The NAND gate 1K computes the NAND of an output from the second flip-flop with an output from the NAND gate 1J and produces a signal 1b from a result of the computation.

The signal 1a is a signal generated based on the reference clock signal ref.CLK and its duty ratio is fixed, while the signal 1b is a signal generated based on the frequency-divided clock signal div.CLK obtained by dividing the output clock signal VCO.CLK using the DIV 5 and its duty ratio changes depending on a phase difference between the frequency-divided clock signal div.CLK and reference clock signal ref.CLK.

The signal 1a is output to the NOR gate 1L. The NOR gate 1L computes the NOR of a reset signal fed from the reset circuit with the signal 1a and outputs a result of the computation to the inverter 1M. The inverter 1M inverts the output from the NOR gate 1L to produce an output signal. The output from the inverter 1M is input to the NAND gate 1C and is also output as an UP signal to output terminal "u" through inverters 1N and 1P.

Also, the signal 1b is output to the NOR gate 1U. The NOR gate 1U computes the NOR of the reset signal from the reset circuit with the signal 1b and outputs a result of the computation to the inverter 1V. The inverter 1V inverts the output from the NOR gate 1U to generate an output signal. The output signal from the inverter 1V is output to the NAND gate 1J and through the inverters 1W, 1X, and 1Y to an output terminal "d" as a DN signal.

A relation between the UP signal and DN signal is described below. That is, if the frequency-divided clock signal div. CLK to be input to the input terminal S2 lags the reference clock signal ref.CLK to be input to the input terminal S1 or if a frequency of the frequency-divided clock signal div.CLK to be input to the input terminal S2 is lower than that of the reference clock signal ref.CLK to be input to the input terminal S1, as shown in FIG. 11, during a period of time from a rise of the reference clock signal ref.CLK input to the input terminal S1 to a rise of the frequency-divided clock signal div.CLK input to the input terminal S2, the UP signal being a downward pulse as shown by being hatched in FIG. 11 is output to the output terminal "u". During this period, no DN signal is output to the output terminal "d".

Moreover, if the frequency-divided clock signal div. CLK to be input to the input terminal S2 leads the reference clock signal ref.CLK to be input to the input terminal S1 or if a frequency of the frequency-divided clock signal div. CLK to be input to the input terminal S2 is higher than that of the reference clock signal ref.CLK to be input to the input terminal S1, as shown in FIG. 12, during a period of time from a rise of the frequency-divided clock signal div.CLK input to the input terminal S2 to a rise of the reference clock signal ref.CLK input to the input terminal S1, the DN signal being an upward pulse as shown by being hatched in FIG. 12 is output to the output terminal "d". During this period, no UP signal is output to the output terminal "u".

The CP circuit 2, by generating an error signal in response to the UP signal or DN signal output from the PFD 1, charges or discharges the LPF 3. Hereinafter, configurations and operations of the CP circuit 2 are described below.

The conventional CP circuit 2, as shown in FIG. 13, includes a positive P-type MOS (Metal Oxide Semiconductor) FET (Field Effect Transistor) 2A and a negative N-type MOSFET 2B. In FIG. 13, the P-type MOSFET 2A, when the UP signal being the downward pulse is fed to the input terminal L1, is turned ON, causing a current to flow out from a power source $V_{DD}$ through the output terminal "e". The N-type MOSFET 2B, when the DN signal being the upward pulse is fed to the input terminal L2, is turned ON, causing a current to flow in a ground through the output terminal "e".

At this time, in the CP circuit 2, a current source I1 to determine a value of a current flowing out through the P-type MOSFET 2A and a current source I2 to determine a value of a current flowing in through the N-type MOSFET 2B are configured so that values of currents flowing through both the current sources I1 and I2 are equal to each other. Hereafter, an output signal from the output terminal "e" of the CP circuit 2 is called an "error signal".

The conventional LPF 3, as shown in FIG. 14, is so configured that a serial circuit made up of a resistor 3A and a first capacitor 3B both being in series connected and a second capacitor 3C are connected in parallel between the terminal for receiving the error signal and the ground and operates so as to remove high frequency components contained in the error signal fed from the CP circuit 2 and to allow low frequency components only to pass. This can avoid a sharp change in a voltage contained in the error signal fed from the CP circuit 2 and causes a smoothed control voltage to be output to the VCO 4.

Next, operations of the conventional PLL circuit will be explained. The VCO 4 outputs an output clock signal VCO.CLK having a frequency corresponding to the control voltage. The DIV 5 divides a frequency of the output clock signal VCO.CLK and outputs the frequency-divided clock signal div.CLK. The PFD 1 compares a phase of the reference clock signal ref.CLK with a phase of the frequency-divided clock signal div.CLK fed from the DIV 5 and outputs either of the UP signal or DN signal based on a difference in the frequency or in the phase between the reference clock signal ref.CLK and the frequency-divided clock signal div.CLK. The CP circuit 2 outputs the error signal based on the UP signal and the DN signal, which causes the control signal to be fed to the VCO 4 through the LPF 3 and causes the VCO 4 to change the frequency of the output clock signal VCO.CLK based on the control signal. This cyclical feedback control enables a frequency and a phase of the output clock signal VCO.CLK from the VCO 4 to match the reference clock signal ref.CTK and causes the output clock signal to be synchronized with the reference clock signal ref.CLK.

At this point, since an amount of a charge current to flow into the LPF 3 from the power source VDD through the P-type MOSFET 2A based on the UP signal, is equal to that of a discharge current to flow out from the LPF 3 to the ground through the N-type MOSFET 2B based on the DN signal, the control on the control signal fed to the VCO 4 used to control the frequency of the output clock signal VCO.CLK is equally exerted regardless of whether the frequency increases or decreases.

FIG. 15 is a timing chart explaining operations of the conventional multiple PLL circuit. In FIG. 15, a state of synchronization of signals in normal operation in a case of a frequency division rate being 8 is shown, in which the frequency-divided signal div.CLK, which is obtained by dividing the output clock signal VCO.CLK from the VCO 4 by eight in the DIV 5, is in synchronization with the reference clock signal ref.CLK.

When a frequency of the reference clock signal ref.CLK increases, the output clock signal VCO.CLK from the VCO 4 also increases. However, if the frequency of the reference clock signal ref.CLK increases abnormally due to some reasons, the frequency of the output clock signal VCO.CLK also increases abnormally. If the frequency increases so much that the DIV 5 cannot be operated, the DIV 5 does not implement its function and no further frequency-divided signal div.CLK is produced. In such the state, since the PFD 4 continues outputting the UP signal, the frequency of the output clock signal VCO.CLK from the VCO 4 increases to an extreme in the end. In this case, a negative feedback loop of the multiple PLL circuit is interrupted and ever if the frequency of the reference clock signal ref.CLK is restored to its original level, the frequency of the output clock signal VCO.CLK is still kept at the extreme level and, therefore, the multiple PLL circuit is not restored to its normal operations and falls into a deadlock state.

FIG. 16 is a timing chart explaining how the conventional multiple PLL circuit falls into a deadlock state. Operations in which the PLL circuit falls into the deadlock state will be explained by comparing them with those in the timing chart showing normal operations.

In FIG. 16, a state in which the frequency of the reference clock signal ref.CLK has increased due to some reasons is shown. It is also shown that the frequency of the output clock signal VCO.CLK from the VCO 4 increases at the same time and, as a result, the period of outputting the UP signal from the PFD 1 becomes longer gradually (see the left half portion in FIG. 16). In FIG. 16, a period shown by being hatched out of the period during which the UP signal is being output represents a period during which the LPF 3 is being charged in response to the error signal fed from the CP circuit 2. At this point, no DN signal from the PFD 1 is being output. Now, since the frequency of the reference clock signal ref.CLK is higher than that of the frequency-divided clock signal div.CLK, the multiple PLL circuit is in a state of starting to increase the frequency of the output clock signal VCO.CLK.

As the period of outputting the UP signal becomes longer, the frequency of the output clock signal VCO.CLK from the VCO 4 increases. However, if the frequency of the output clock signal VCO.CLK increases beyond a specified limit, the DIV 5 cannot catch up with the increase and stops operation in the end and, as a result, the frequency-divided clock signal div.CLK is not output, which means that there is no edge of a pulse to be compared by the PFD 1 and which causes the UP signal to be continuously output (see the right half portion in FIG. 16). Therefore, since the frequency of the output clock signal VCO.CLK from the VCO 4 increases to an extreme and the negative feedback loop is interrupted at the DIV 5, the multiple PLL circuit falls into a uncontrollable state and into a deadlock state.

Thus, if the oscillation frequency of a signal output from the VCO 4 increases abnormally, since a frequency dividing circuit adapted to divide the oscillation frequency of the signal output from the VCO 4 falls in an inoperable state, causing no further input of a feedback signal to the PFD 1, the multiple PLL circuit falls into a deadlock state and its control is not restored to its normal state. It is therefore desirous that, if the PLL circuit falls into a deadlock state, by detecting the deadlock state by some means and by exerting control so as to clear the deadlock state, it can be automatically restored to its normal operation.

A multiple PLL circuit having such the function of clearing the deadlock state is disclosed in, for example, Japanese Patent Application Laid-open No. Hei 11-122102. In the disclosed conventional multiple PLL circuit, a flip-flop is provided which is set by a rise of an output signal from a dividing circuit adapted to divide a frequency of a reference signal and is reset by a signal having detected a change of a feedback signal output from a logic circuit adapted to divide an oscillation frequency of a signal output from a VCO. When a change of the feedback signal is detected during a period of time from a rise to another rise of the output signal from the frequency dividing circuit, an output signal from the flip-flop goes low, which causes a control signal controlling circuit to transfer an UP signal and DN signal output from a phase comparator, as they are, to a charge pumping circuit to restore the PLL circuit to its normal operation.

On the other hand, when the PLL circuit falls in a deadlock state in which a feedback signal is not output, a change of the feedback signal is not detected and therefore an output signal from the flip-flop goes high and, as a result, both the UP signal and DN signal output from the control signal controlling circuit go high. This causes an error signal output from a charge pumping circuit to lower a voltage level of a control signal output from the LPF and, as a result, an oscillation frequency of a signal from the VCO is lowered, thus restoring the PLL circuit to its normal operation.

However, the conventional multiple PLL circuit having the deadlock clearing function has a problem. That is, in the flip-flop employed in the conventional PLL circuit which is adapted to generate a control signal for the control signal controlling circuit, periodical setting and resetting are repeated in a normal operation state, however, timing with which the resetting is performed is not so simple. In other words, there is a possibility that critical timing exists with which an output voltage of the low pass filter is accidentally lowered even in a state of normal operations of the multiple PLL circuit, depending on the oscillation frequency of the signal from the VCO.

Thus, in the conventional PLL circuit having the deadlock preventing mechanism, since the deadlock clearing circuit is constructed of an element having an architecture being totally different from a mechanism causing the deadlock there is a risk that normal operations of the multiple PLL circuit itself are disturbed.

SUMMARY OF THE INVENTION

In view of the above, it is an object of the present invention to provide a multiple phase-locked loop circuit capable of starting operations of a deadlock preventing mechanism which is triggered by an interruption of a frequency-divided clock output from a voltage controlling oscillator caused by an inoperable state of a frequency divider and of reliably preventing occurrence of a deadlock state without disturbing normal operations while no deadlock has occurred by using a circuit in which an operation of a phase/frequency comparator being one of causes for the occurrence of the deadlock is utilized in a reverse manner, for preventing the deadlock.

According to a first aspect of the present invention, there is provided a multiple phase-locked loop circuit including:

a first phase/frequency comparing unit to compare a phase or a frequency of a reference clock with a phase or a frequency of a first frequency-divided clock and to output an UP signal or a first DN signal depending on whether the first frequency-divided clock lags or leads the reference clock or whether a frequency of the first frequency-divided clock is lower or higher than that of the reference clock;

a charge pumping unit to generate an error signal by causing a current to flow out, in response to the UP signal, and by causing a current to flow in, in response to the first DN signal;

a low pass filter to smooth the error signal and to output the smoothed error signal as a control voltage;

a voltage control oscillating unit to generate an output clock whose frequency changes to be high or low depending on whether the control voltage is high or low;

a first frequency-divided unit to output the first frequency-divided clock obtained by dividing the frequency of the output clock at a specified frequency division rate;

a second phase/frequency comparing unit to compare a phase or a frequency of the first frequency-divided clock with a phase or a frequency of the reference clock or of a clock having a frequency being lower than that of the reference clock and, when the first frequency-divided clock lags the frequency clock or the clock having the frequency being lower than that of the reference clock or a frequency of the first frequency-divided clock is lower than that of the reference clock or of the clock having the frequency being lower than that of the reference clock, to output a second DN signal; and wherein the multiple phase-locked loop circuit is able to get out of a deadlock state by using the second DN signal.

In the foregoing, a preferable mode is one that wherein includes a second frequency-dividing unit to output a second frequency-divided clock obtained by dividing the reference clock at a specified frequency division rate and wherein the second phase/frequency comparing unit compares a phase of the first frequency-divided clock with a phase of the second frequency-divided clock and, when a frequency of the first frequency-divided clock is lower than that of the second frequency-divided clock, outputs the second DN signal.

According to a second aspect of the present invention, there is provided a multiple phase-locked loop circuit including a first phase/frequency comparing unit to compare a phase or a frequency of a reference clock with a phase or a frequency of a first frequency-divided clock and to output an UP signal or a first DN signal depending on whether the first frequency-divided clock lags or leads the reference clock or whether a frequency of the first frequency-divided clock is lower or higher than that of the reference clock;

a second phase/frequency comparing unit to compare a phase or a frequency of the first frequency-divided clock with a phase or a frequency of the second frequency-divided clock and, when the first frequency-divided clock lags the second frequency-divided clock or when a frequency of the first frequency-divided clock is lower than that of the second frequency-divided clock, to output a second DN signal;

a charge pumping unit to generate an error signal by causing a current to flow out in response to the UP signal, by causing a same amount of currents as that of the current flowing out in response to the UP signal to flow out in response to the first DN signal and by causing an amount of currents being greater than that of currents flowing in response to the UP signal or in response to the first DN signal to flow in, in response to the second DN signal;

a low pass filter to smooth the error signal and to output the smoothed error signal as a control voltage;

a voltage control oscillating unit to generate an output clock whose frequency changes to be high or low depending on whether the control voltage as high or low;

a first frequency-divided unit to output the first frequency-divided clock obtained by dividing the frequency of the output clock at a specified frequency division rate; and a second frequency-divided unit to output the second frequency-divided clock obtained by dividing the frequency of the reference clock at a specified frequency division rate.

According to a third aspect of the present invention, there is provided a multiple phase-locked loop circuit including:

a first phase/frequency comparing unit to compare a phase or a frequency of a reference clock with a phase or a frequency of a frequency-divided clock and to output an UP signal or a first DN signal depending on whether a first frequency-divided clock lags or leads the reference clock or whether a frequency of the first frequency-divided clock is lower or higher than that of the reference clock;

a second phase/frequency comparing unit to compare a phase or a frequency of the frequency-divided clock with a phase or a frequency of a reference clock and, when the frequency-divided clock lags the reference clock or when a frequency of the frequency-divided clock is lower than that of the reference clock, to output a second DN signal;

a charge pumping unit to generate an error signal by causing a current to flow out in response to the UP signal, by causing a same amount of currents as that of the current flowing out in response to the UP signal to flow in, in response to the first DN signal and by causing an amount of currents being greater than that of the current flowing in response to the UP signal or in response to the first DN signal to flow in, in response to the second DN signal and to stop the current flowing in based on the second DN signal, in response to a control voltage detecting signal;

a low pass filter to smooth the error signal and to output the smoothed error signal as a control signal;

a voltage control oscillating unit to generate an output clock whose frequency changes to be high or low depending on whether the control voltage is high or low;

a frequency-divided unit to output the frequency-divided clock obtained by dividing the frequency of the output clock at a specified frequency division rate; and a control voltage detecting unit to output the control voltage detecting signal when the control voltage drops below a specified voltage level.

In the foregoing, a preferable mode is one wherein the control voltage detecting unit performs a hysteresis operation which outputs the control voltage detecting signal when the control voltage has dropped below the specified voltage level and thereafter keeps a state of outputting the control voltage detecting signal and which stops outputting of the control voltage detecting signal when the control voltage has risen and exceeded a second specified voltage level.

Also, a preferable mode is one wherein the charge pumping unit is so configured so as to stop, when the second DN signal is output, a current flowing out in response to the UP signal.

Furthermore, a preferable mode is one wherein the low pass filter is so configured that a serial circuit made up of a resistor and a first capacitor being in series connected and a second capacitor are connected in parallel between a terminal for receiving the error signal and a ground.

With the above configurations, a first frequency-divided clock is generated by dividing a frequency of an output clock signal output from the control voltage oscillating unit and a second frequency-divided clock is generated by dividing a frequency of a reference clock. By using the first phase/frequency comparing unit, a phase or a frequency of the first frequency-divided clock is compared with a phase or a frequency of the reference clock and an UP signal or a first DN signal is output depending on whether the first frequency-divided clock lags or leads the reference clock or whether a frequency of the first frequency-divided clock is lower or higher than that of the reference clock. Moreover, by using the second phase/frequency comparing unit, a phase or a frequency of the first frequency-divided clock is compared with a phase or a frequency of the second frequency-divided clock and if the first frequency-divided clock lags the second frequency-divided clock or the frequency of the first frequency-divided clock is lower than that of the second frequency-divided clock, a second DN signal is output. By using the charge pumping unit, an error signal is generated by causing a current to flow out in response to the UP signal, by causing the same amount of currents as that of the current flown out in response to the UP signal to flow in, in response to the first DN signal and by causing an amount of currents being greater than that of the current flowing in response to the UP signal or in response to the first DN signal to flow in, in response to the second DN signal. By using the low pass filter, the error signal is smoothed and the smoothed signal is output as a control signal and, by using the voltage control oscillating unit, an output clock is generated, the frequency of which changes to be high or low depending on which the control voltage is large or small. Therefore, even if the multiple PLL circuit falls into a deadlock state due to no outputting of the first frequency divided clock caused by an abnormal increase of the frequency of the output clock, the frequency of the output clock is rapidly lowered, thus enabling the multiple PLL circuit to get out of the deadlock state.

With another configuration as above, a frequency-divided clock is generated by dividing a frequency of an output clock signal output from the voltage control oscillating unit. By using the first phase/frequency comparing unit, a phase or a frequency of the frequency-divided clock is compared with a phase or a frequency of the reference clock and an UP signal or a first DN signal is output depending on whether the frequency-divided clock lags or leads the reference clock or whether the frequency of the frequency-divided clock is lower or higher than that of the reference clock. Similarly, by using the second phase/frequency comparing unit, a phase or a frequency of the frequency-divided clock is compared with a phase or a frequency of the reference clock and if the frequency-divided clock lags the reference clock or if the frequency of the frequency-divided clock is lower than that of the reference clock, a second DN signal is output. Moreover, By using the charge pumping unit, an error signal is generated by causing a current to flow out in response to the UP signal, by causing the same amount of currents as that of the current flown out in response to the UP signal to flow in, in response to the first DN signal and by causing an amount of currents being greater than that of the current flowing in response to the UP signal or in response to the first DN signal to flow in, in response to the second DN signal. By using the low pass filter, the error signal is smoothed and the smoothed signal is output as a control signal and, by using the voltage control oscillating unit, an output clock is generated, the frequency of which changes to be high or low depending on which the control voltage is large or small. Furthermore, by using the control voltage detecting unit, a control voltage detecting signal is output when a control voltage has dropped below a specified voltage level and, by using the charge pumping unit, flow-in of the currents based on the second DN signal is stopped in response to the control voltage detecting signal. Therefore, even if no frequency divider to divide a frequency of the reference clock is provided on an input side of the second phase/frequency comparing unit, the multiple PLL circuit can operate normally as the multiple PLL circuit having a deadlock preventing function.

BRIEF DESCRIPTION OF THE DRAWINGS

The above and other objects, advantages, and features of the present invention will be more apparent from the following description taken in conjunction with the accompanying drawings in which.

DETAILED DESCRIPTION OF THE PREFERRED EMBODIMENTS

Best modes of carrying out the present invention will be described in further detail using various embodiments with reference to the accompanying drawings.

First Embodiment

Figure 1:
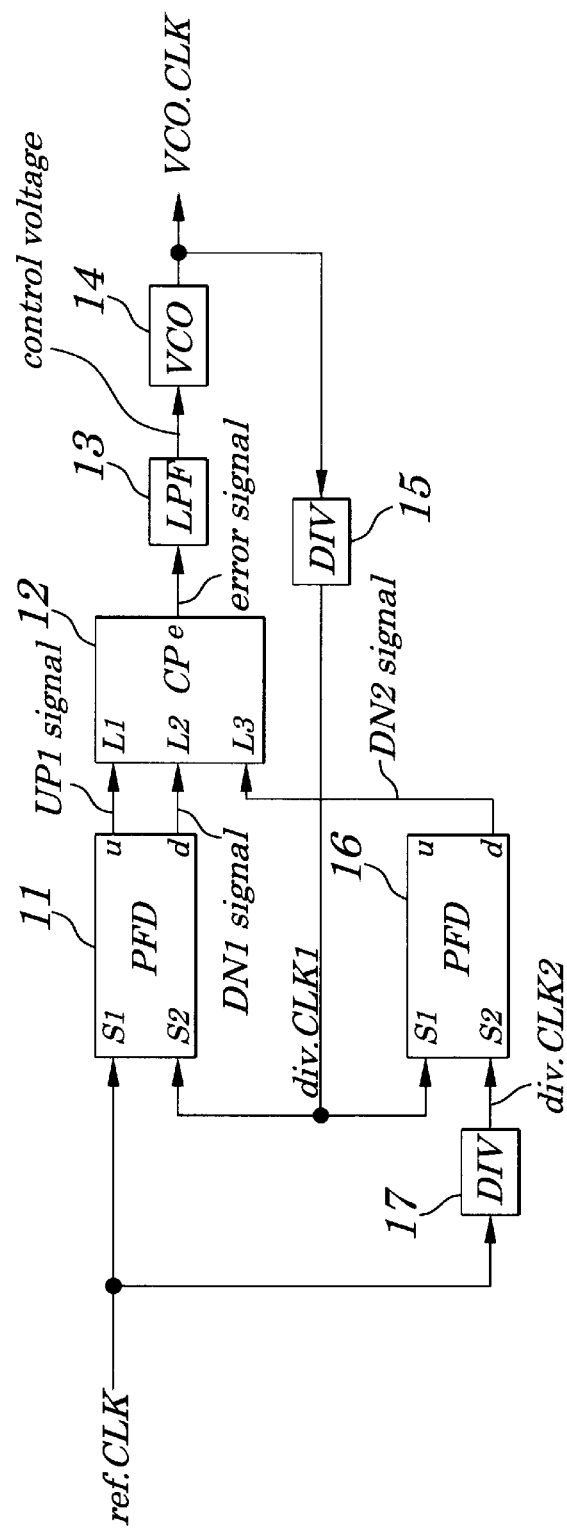
FIG. 1 is a schematic block diagram showing configurations of a multiple PLL circuit according to a first embodiment of the present invention.
Figure 2:
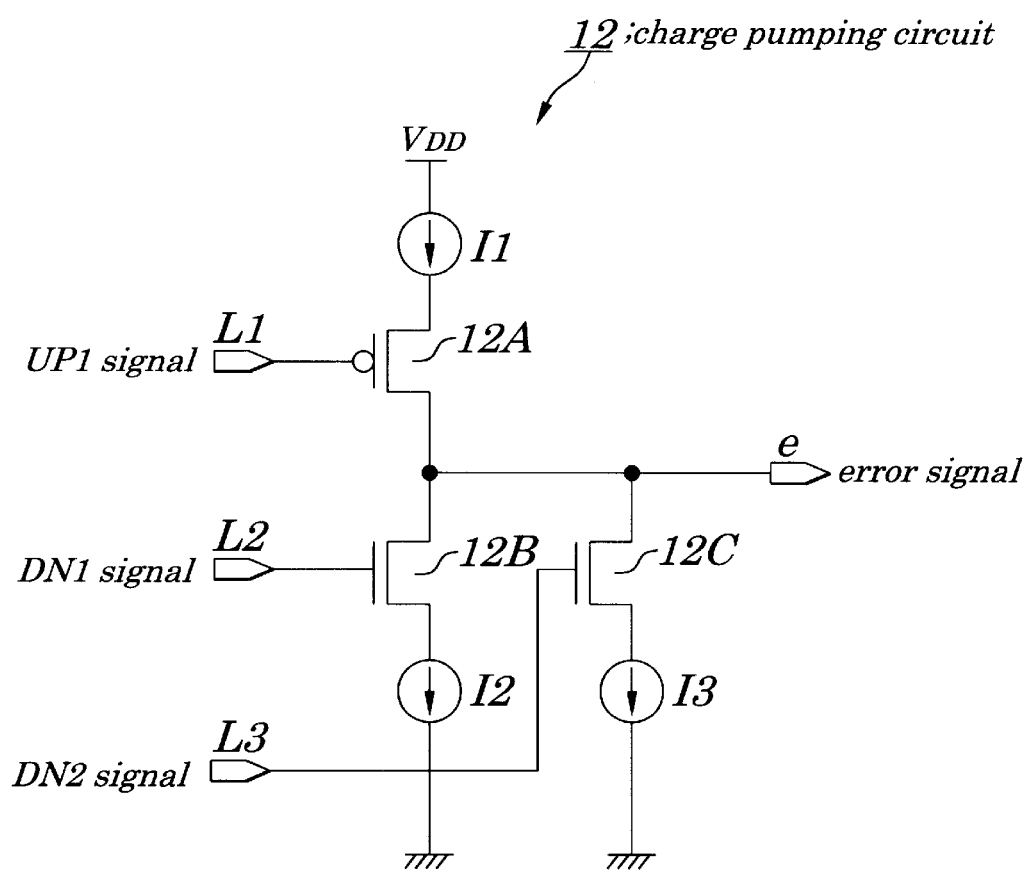
FIG. 2 is a circuit diagram showing an example of configurations of a charge pumping circuit according to the first embodiment of the present invention.
Figure 3:
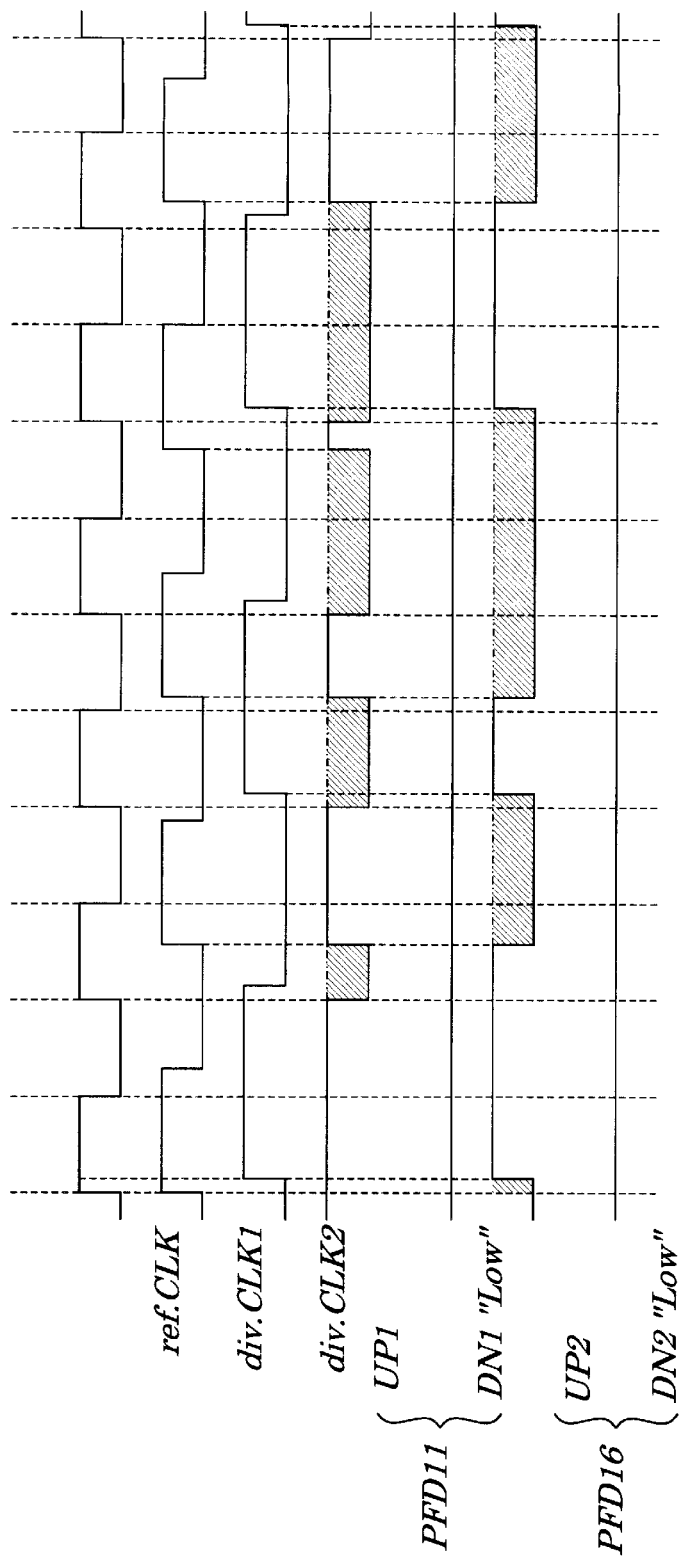
FIG. 3 is a timing chart explaining an operation of each signal at time of ordinary operations of the multiple PLL circuit according to the first embodiment of the present invention.
Figure 4:
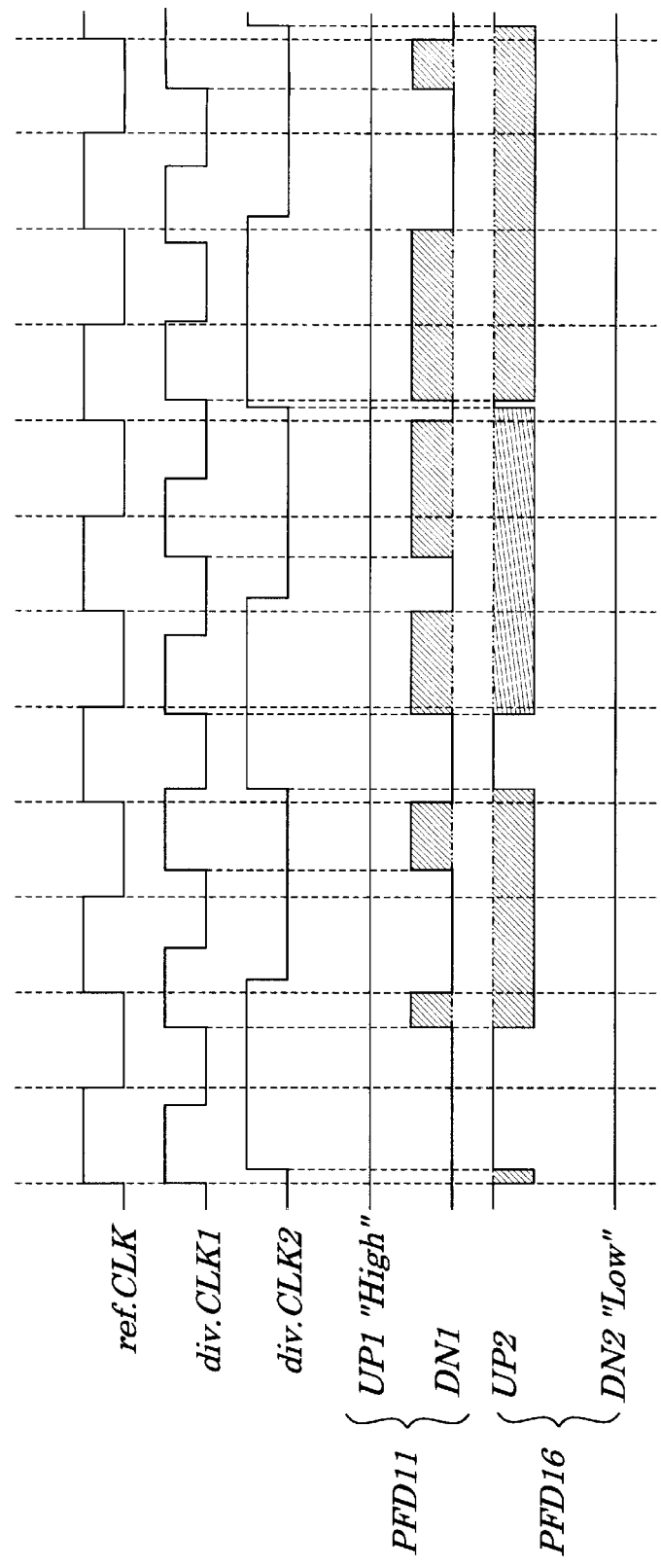
FIG. 4 is a timing chart explaining the operation of each signal at time of ordinary operations of the multiple PLL circuit according to the first embodiment of the present invention.
Figure 5:
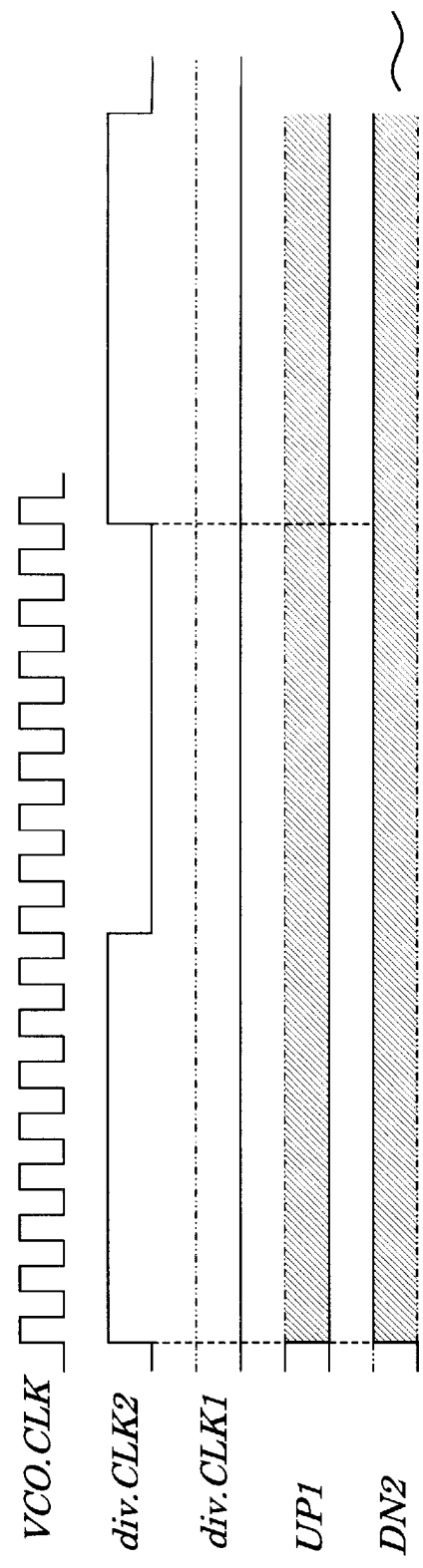
FIG. 5 is a timing chart explaining operations of signals at time of getting out of a deadlock state in the first embodiment of the present invention.

FIG. 1 is a schematic block diagram showing configurations of a multiple PLL circuit according to a first embodiment of the present invention. FIG. 2 is a circuit diagram showing an example of configurations of a charge pumping (CP) circuit 12 according to the first embodiment. FIG. 3 is a timing chart (I) explaining an operation of each signal at time of ordinary operations of the multiple PLL circuit according to the first embodiment. FIG. 4 is a timing chart (II) explaining an operation of each signal at time of ordinary operations of the multiple PLL circuit according to the first embodiment. FIG. 5 is a timing chart explaining operations of signals at time of getting out of the deadlock state in the first embodiment.

The multiple PLL circuit of the first embodiment, as shown in FIG. 1, chiefly includes a first phase/frequency comparator (PFD) 11, a charge pumping circuit 12, a low pass filter (LPF) 13, a voltage controlling oscillator (VCO) 14, a first frequency divider (DIV) 15, a second PFD 16, and a second frequency divider (DIV) 17. Configurations of the first PFD 11, the LPF 13, and the VCO 14 are the same as those of the PFD 1, the LPF 3, and the VCO 4 employed in the conventional multiple PLL circuit shown in FIG. 9, respectively.

As shown in FIGS. 1 and 2, an UP1 signal fed from the first PFD 11 is input to an input terminal L1 of the charge pumping circuit 12 and a DN1 signal fed from the first PFD 11 is input to an input terminal L2 of the charge pumping circuit 12. A DN2 signal fed from the second PFD 16 is input to an input terminal L3 of the charge pumping circuit 12. In response to the UP1 signal input to the input terminal L1, the DN1 signal input to the input terminal L2 and the DN2 signal input to the input terminal L3, an error signal is generated at an output terminal "e", which causes a current to flow out from a power source VDD through the output terminal "e" or a current to flow from the power source VDD towards a ground. The first frequency divider 15 divides a frequency of an output clock signal VCO.CLK output from the VCO 14 at a specified frequency division rate and outputs the frequency-divided clock signal div.CLK1. The second frequency divider 17 divides a frequency of a reference clock signal ref.CLK at a specified frequency division rate and outputs the frequency-divided clock signal div.CLK2. The second PFD 16 has the same configurations as the first PFD 11. The frequency-divided clock signal div.CLK1 fed from the first frequency divider 15 is input to an input terminal S1 of the second PFD 16. The frequency-divided clock signal div.CLK2 fed from the second frequency divider 17 is input to an input terminal S2. The second PFD 16 compares a phase or a frequency of the frequency-divided clock signal div. CLK1 with a phase or a frequency of the frequency-divided clock signal div.CLK2. When the frequency-divided clock signal div.CLK1 lags the frequency-divided clock signal div.CLK2 or a frequency of the frequency-divided clock signal div.CLK1 is lower than that of the frequency-divided clock signal div.CLK2, the second PFD 16 outputs the DN2 signal to its output terminal "d".

Figure 9:
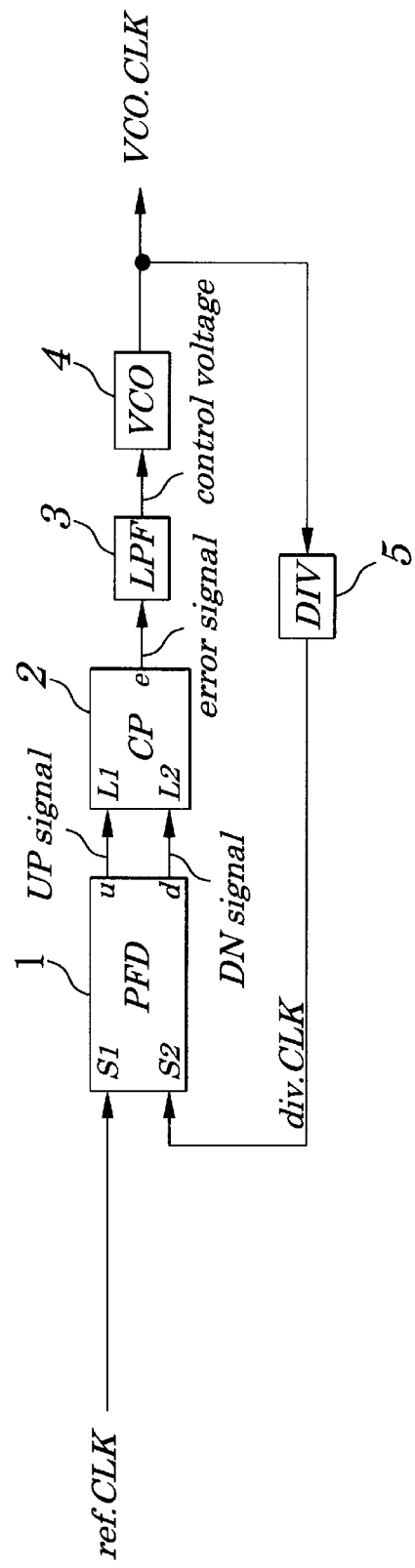
FIG. 9 is a block diagram showing configurations of a conventional multiple PLL circuit.
Figure 10:
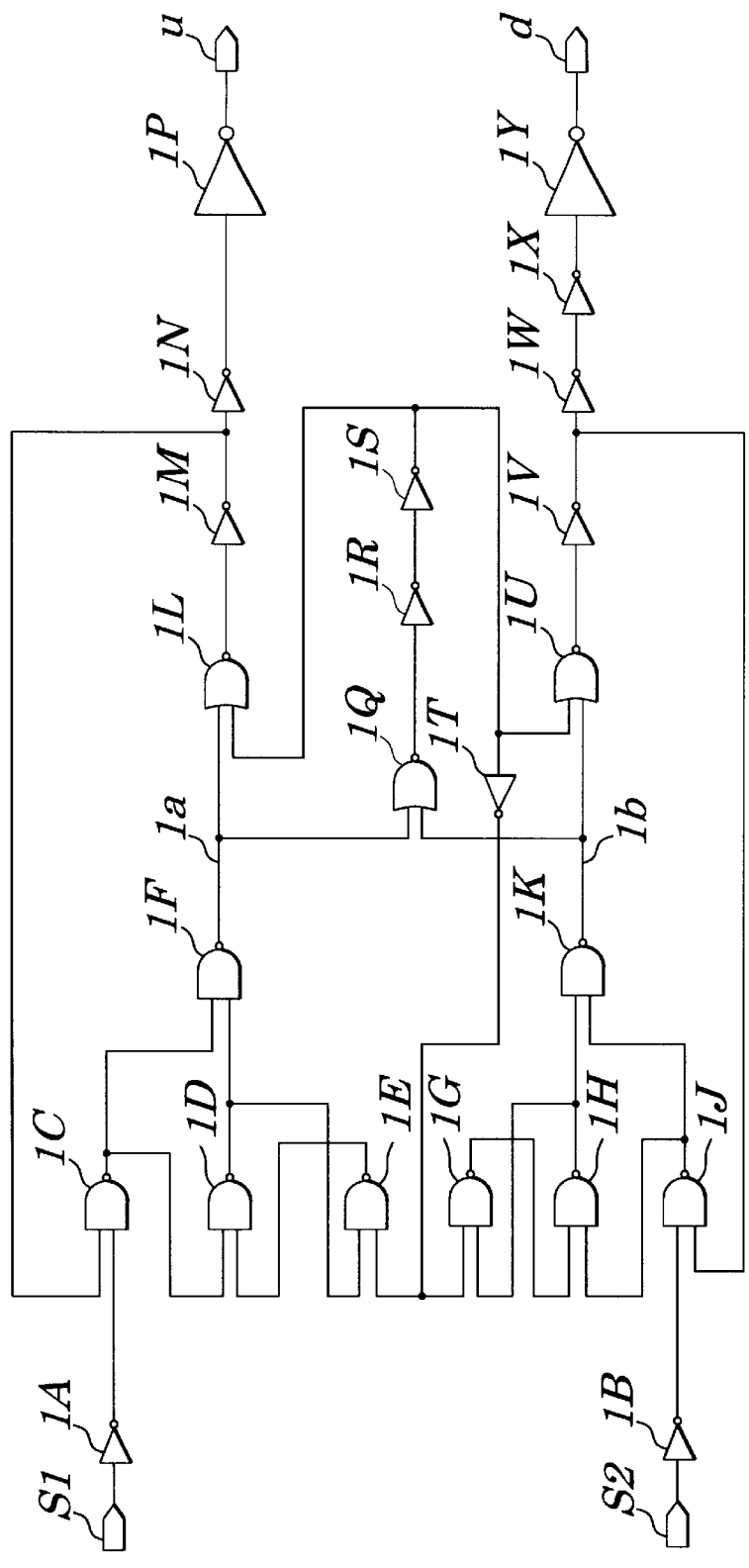
FIG. 10 is a circuit diagram showing configurations of a conventional phase/frequency comparator.
Figure 11:
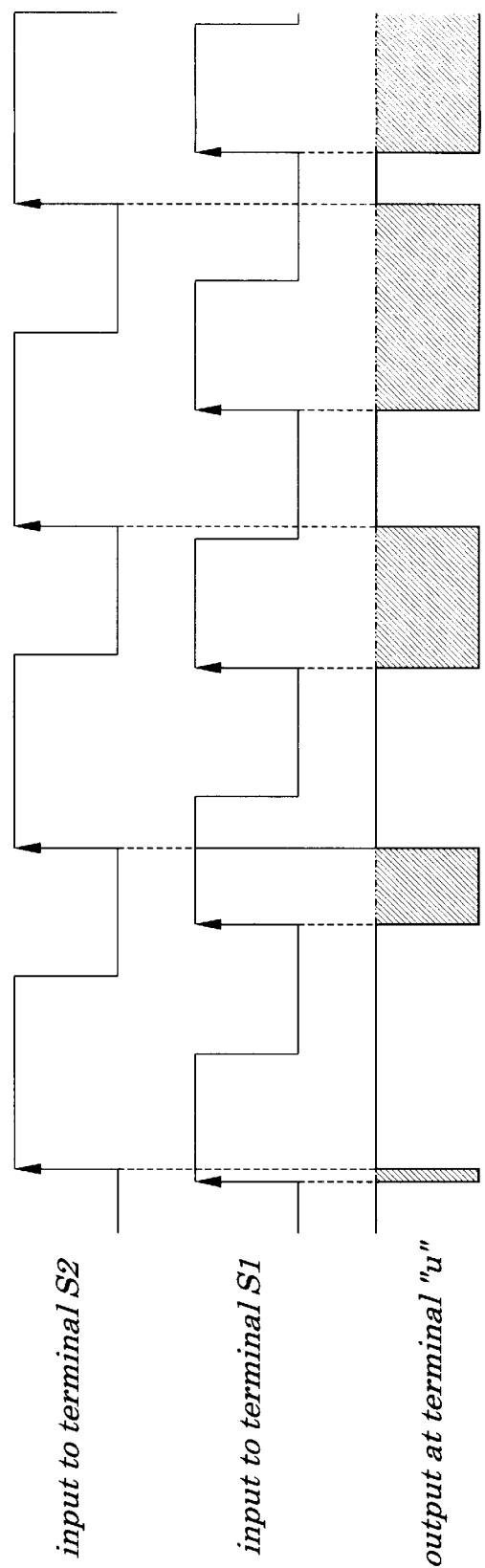
FIG. 11 is a timing chart explaining operations of the conventional multiple PLL circuit performed when a frequency of a divided clock signal is low.
Figure 12:
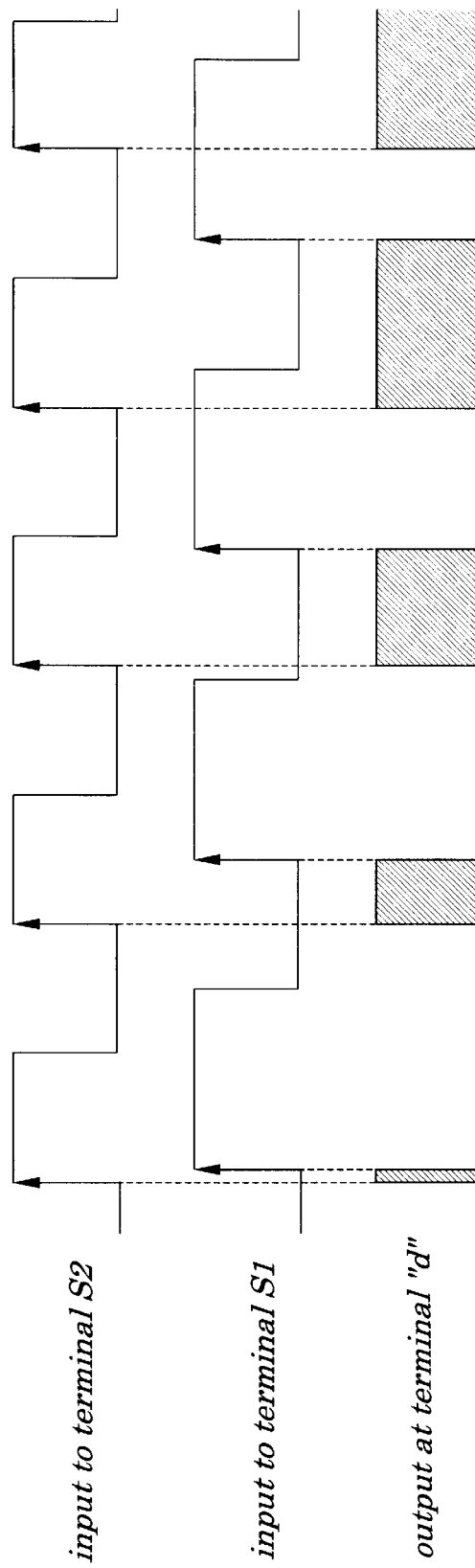
FIG. 12 is a timing chart explaining operations of the conventional multiple PLL circuit performed when a frequency of a divided clock signal is high.
Figure 13:
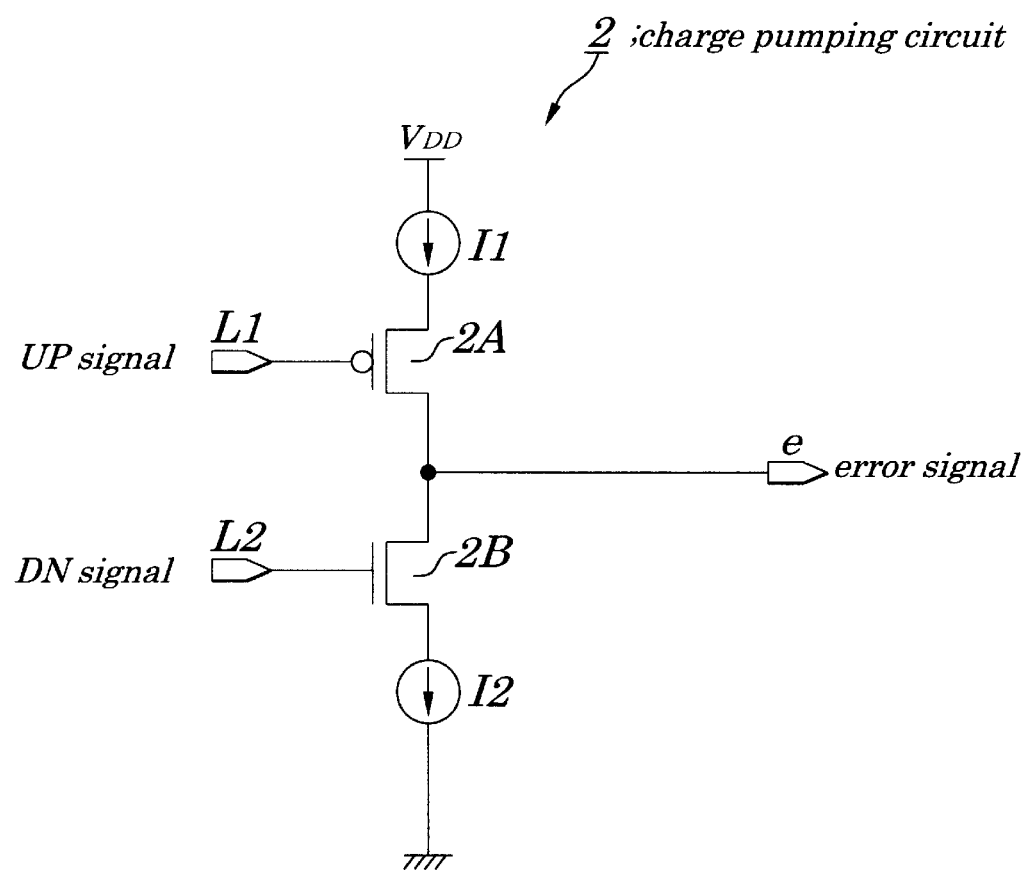
FIG. 13 is a circuit diagram showing configurations of a conventional charge pumping circuit.
Figure 14:
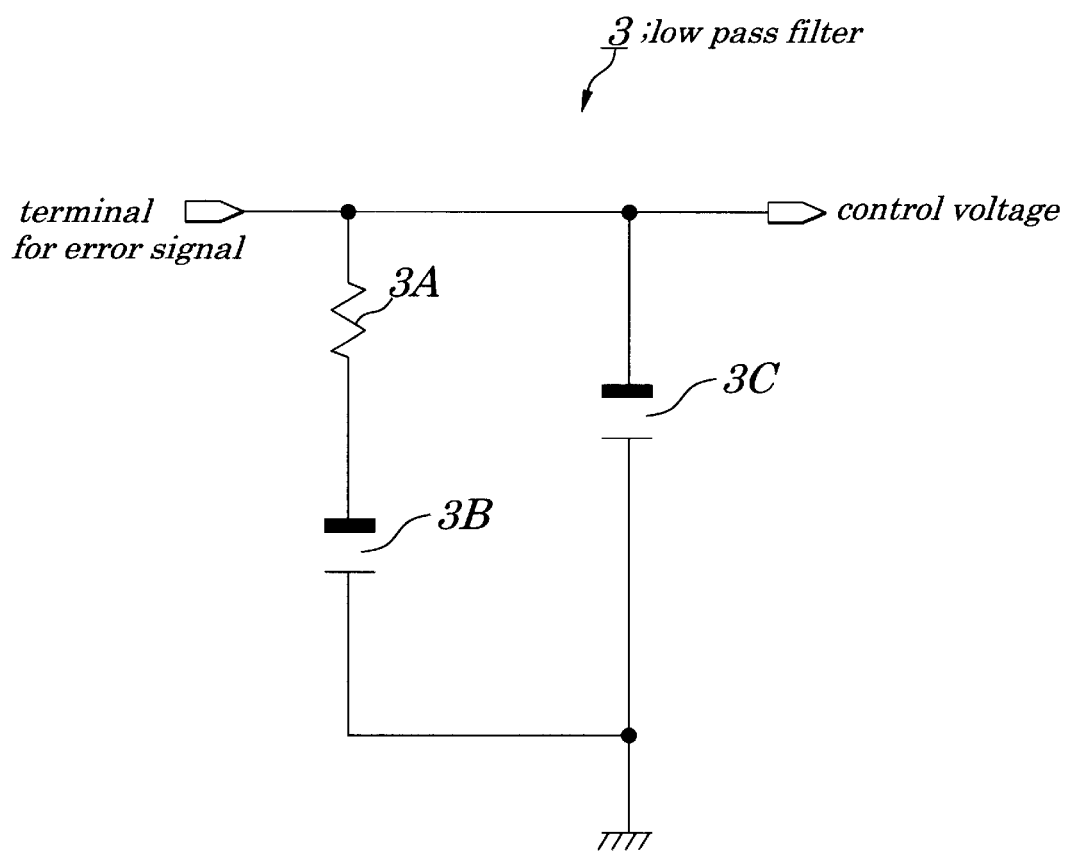
FIG. 14 is a circuit diagram showing configurations of a conventional low pass filter.
Figure 15:
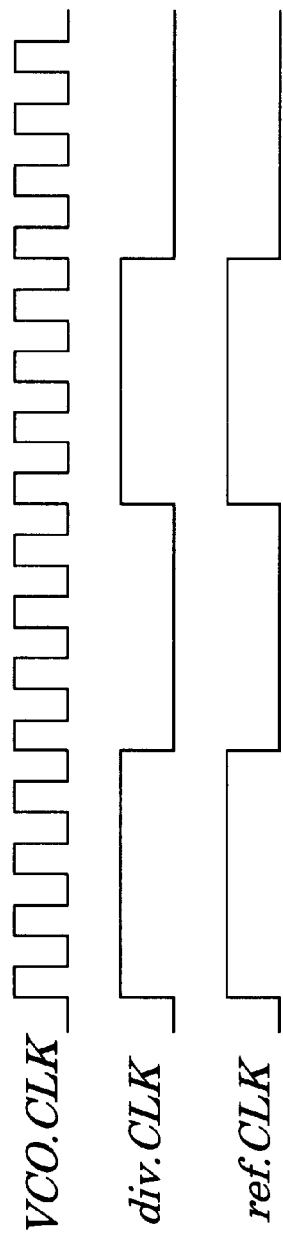
FIG. 15 is a timing chart explaining operations of the conventional multiple PLL circuit.
Figure 16:
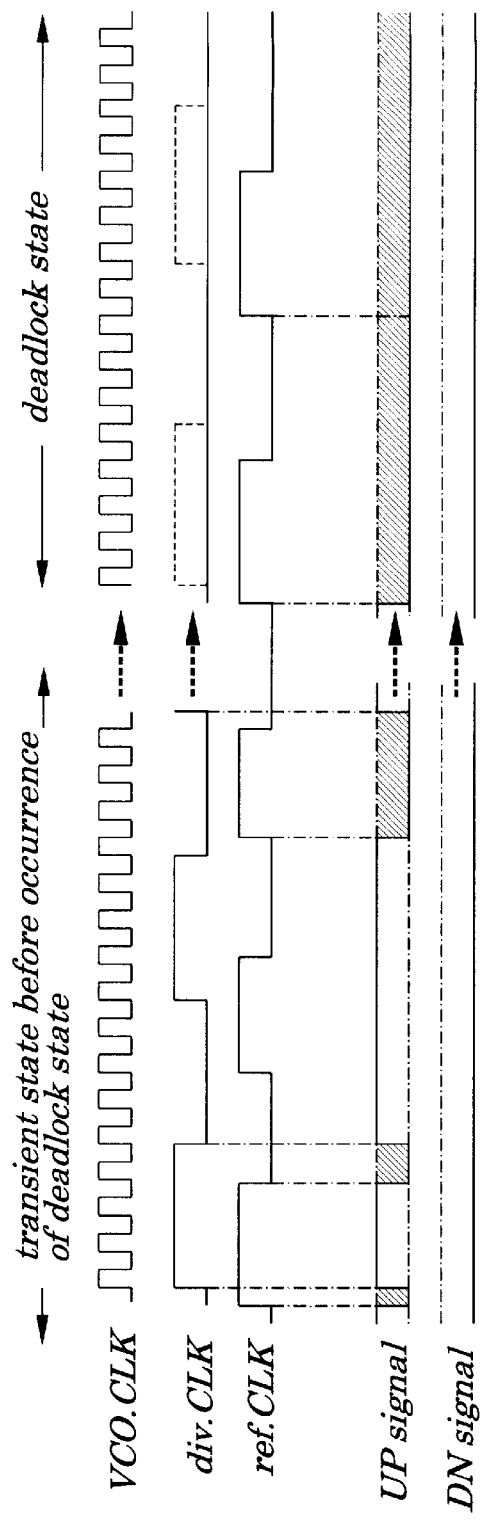
FIG. 16 is a timing chart explaining how the conventional multiple PLL circuit falls into a deadlock state.

Operations of the first PFD 11 are the same as those of the conventional PFD 1 shown in FIG. 9. If the frequency-divided clock signal div.CLK1 to be input to the input terminal S2 of the first PFD 11 lags the reference clock signal ref.CLK to be input to the input terminal S1 or if a frequency of the frequency-divided clock signal div.CLK1 to be input to the input terminal S2 of the first PFD 11 is lower than that of the reference clock signal ref.CLK, as in the case shown in FIG. 11, the UP1 signal is output to an output terminal "u" by a downward pulse produced by a rise of the reference clock signal ref.CLK and by a rise of the frequency-divided clock signal div.CLK1. During this period, the DN1 signal being almost negligible is output to an output terminal "d" of the first PFD 11. Also, if the frequency-divided clock signal div.CLK1 to be input to the input terminal S2 leads the reference clock signal ref.CLK to be input to the input terminal S1 or if a frequency of the frequency-divided clock signal div.CLK1 is higher than that of the reference clock signal ref.CLK, as in the case shown in FIG. 12, the DN1 signal is output to the output terminal "d" by an upward pulse produced by a rise of the frequency-divided clock signal div.CLK1 and a rise of the reference clock signal ref.LK. During this period, the UP1 signal being almost negligible is output to an output terminal "u" of the first PFD 11.

Next, operations of the second PFD 16 will be explained. If the frequency-divided clock signal div.CLK2 to be input to the input terminal S2 of the second PFD 16 lags the frequency-divided clock signal div.CLK1 to be input to the input terminal S1 of the second PFD 16 or if a frequency of the frequency-divided clock signal div.CLK2 is lower than that of the frequency-divided clock signal div.CLK1, an UP2 signal is output to an output terminal "u" of the second PFD 16 by a downward pulse produced by a rise of the frequency-divided clock signal div.CLK1 and a rise of the frequency-divided clock signal div.CLK2. During this period, the DN2 signal being almost negligible is output to the output terminal "d" of the first PFD 16.

Also, if the frequency-divided clock signal div.CLK2 to be input to the input terminal S2 of the second PFD 16 leads the frequency-divided clock signal div.CLK1 to be input to the input terminal S1 of the second PFD 16 or if a frequency of the frequency-divided clock signal div.CLK2 is higher than that of the frequency-divided clock signal div.CLK1, the DN2 signal is output to the output terminal "d" of the second PFD 16 by an upward pulse produced by a rise of the frequency-divided clock signal div.CLK2 and a rise of the frequency-divided clock signal div.CLK1. During this period, the UP2 signal (not shown in FIG. 1) being almost negligible is output to the output terminal "u" of the first PFD 16. However, in the embodiment, the UP2 signal being output to the output terminal "u" of the second PFD 16 is not transmitted to an outside and is not input to the charge pumping circuit 12 accordingly.

The charge pumping circuit 12 generates an error signal in response to the UP1 signal and DN1 signal both being output from the first PFD 11 and in response to the DN2 signal being output from the second PFD 16 and the LPF 13 is charged and discharged by the error signal.

Hereinafter, configurations and operations of the charge pumping circuit 12 will be explained. The charge pumping circuit 12 of the first embodiment, as shown in FIG. 2, has a P-type MOSFET 12A, N-type MOSFET 12B, and N-type MOSFET 12C.

The P-type MOSFET 12A, when the UP1 signal being a downward pulse is fed to the input terminal L1, is turned ON, causing a current from the power source VDD to flow out through the output terminal "e". The N-type MOSFET 12B, when the DN1 signal being an upward pulse is fed to the input terminal L2, is turned ON, causing a current to flow through the output terminal "e" towards a ground. Also, the N-type MOSFET 12C, when the DN2 signal being an upward pulse is fed to the input terminal L3, is turned ON, causing a current to flow through the output terminal "e"towards a ground. A current source I1 operated to determine a value of the current flowing out through the P-type MOSFET 12A and a current source I2 operated to determine a value of the current flowing in the N-type MOSFET 12B are configured so that values of currents flowing through both the current sources I1 and I2 are equal to each other. Moreover, a current source I3 operated to determine a value of the current flowing in through the N-type MOSFET 12C is so configured that a value of a current flowing through the current source I3 is larger by n-times than that of the current source I2. That is, generally, a capability of a MOSFET to allow a current to pass depends on a gate width of the MOSFET. Ordinarily, if a P-type MOSFET has the same configurations as an N-type MOSFET, the capability of the P-type MOSFET to allow a current to pass is larger by almost 1/2 times than that of the N-type MOSFET. Therefore, if the P-type MOSFET and N-type MOSFET have same gate length, a gate width of the N-type MOSFET making up, for example, the current source I2 may be set so as to be larger by almost 1/2 times than that of the P-type MOSFET making up, for example, the current source I1 and a gate width of the N-type MOSFET making up, for example, the current source I3 maybe set so as to be larger by almost n/2 times than that of the P-type MOSFET making up, for example, the current source I3. Hereinafter, the input and output signals being input and output to and from the terminal "e" of the charge pumping circuit 12 is called an "error signal".

Next, operations of the multiple PLL circuit of the first embodiment are described by referring to FIGS. 1 to 5. FIG. 3 shows examples of operations of each signal at time of ordinary operations in the multiple PLL circuit and shows a case in which a frequency division rate employed in the second frequency divider 17 is two and in which the frequency of the frequency-divided clock signal div.CLK1 fed from the first frequency divider 15 is lower than that of the reference clock signal ref.CLK.

In this case, the first PFD 11 compares a phase or a frequency of a signal input to the input terminal S1 with a phase or a frequency of a signal input to the input terminal S2 and since the frequency-divided clock signal div.CLK1 input to the input terminal S2 lags the reference clock signal ref.CLK input to the input terminal S1 or since the frequency of the frequency-divided clock signal div.CLK1 is lower than that of the reference clock signal ref.CLK, the UP1 signal is generated. At this point, the DN1 signal remains low. Also, the second PFD 16 compares a phase or a frequency of a signal input to the input terminal S1 with a phase or a frequency of a signal input to the input terminal S2 and since the frequency-divided clock signal div.CLK2 input to the input terminal S2 lags the frequency-divided clock signal div.CLK1 input to the input terminal S1 or since the frequency of the frequency-divided clock signal div.CLK1 is lower than that of the frequency-divided clock signal div.CLK1, the UP2 signal is generated. At this point, the DN2 signal remains low.

Since the UP2 signal produced by the second PFD 16 is not transmitted to an outside, only the UP1 signal output from the first PFD 11 is input to the charge pumping circuit 12, which controls so as to increase a frequency of the output clock signal VCO.CLK output from the VCO 14 and, as a result, the frequency of the frequency-divided clock signal div.CLK1 is increased and control is exerted on an oscillation frequency of the signal output from the VCO 14 so that the frequency of the frequency-divided clock signal div. CLK matches a frequency of the reference clock signal ref.CLK.

FIG. 4 also shows operations of each signal at time of ordinary operations in the multiple PLL circuit and shows a case in which a frequency division rate employed in the second frequency divider 17 is two and in which the frequency of the frequency-divided clock signal div.CLK1 fed from the first frequency divider 15 is higher than that of the reference clock signal ref.CLK. In this case, the first PFD 11 compares a phase or a frequency of a signal input to the input terminal S1 with a phase or a frequency of a signal input to the input terminal S2 and since the frequency-divided clock signal div.CLK1 input to the input terminal S2 leads the reference clock signal ref.CLK input to the input terminal S1 or since the frequency of the frequency-divided clock signal div.CLK1 is higher than that of the reference clock signal ref.CLK, the DN1 signal is generated. At this point, the UP1 signal remains high. Also, the second PFD 16 compares a phase or a frequency of a signal input to the input terminal S1 with a phase or a frequency of a signal input to the input terminal S2 and since the frequency-divided clock signal div.CLK2 input to the input terminal S2 lags the frequency-divided clock signal div.CLK1 input to the input terminal S1 or since the frequency of the frequency-divided clock signal div.CLK1 is lower than that of the frequency-divided clock signal div.CLK1, the UP2 signal is generated. At this point, the DN2 signal remains low.

Since the UP2 signal produced by the second PFD 16 is not transmitted to the outside, only the DN1 signal output from the first PFD 11 is input to the charge pumping circuit 12, which controls so as to lower the frequency of the output clock signal VCO.CLK output from the VCO 14 and, as a result, the frequency of the frequency-divided clock signal div.CLK1 is decreased and control is exerted on the oscillation frequency of the signal output from the VCO 14 so that the frequency of the frequency-divided clock signal div.CLK1 matches a frequency of the reference clock signal ref.CLK.

FIG. 5 shows operations of signals at time of the multiple PLL circuit getting out of the deadlock state in which a frequency division rate of the first frequency divider 15 is eight and a frequency division rate of the second frequency divider 17 is two in the multiple PLL circuit of the first embodiment of the present invention.

In the multiple PLL circuit shown in FIG. 1, if the frequency-divided clock signal div.CLK1 is not output due to an abnormal increase in the frequency of the reference clock signal ref.CLK caused by some reasons and due to an increase in the output clock signal VCO.CLK, the output clock signal VCO.CLK increases to an extreme and, as a result, the multiple PLL circuit falls into a deadlock state. In this case, as shown in FIG. 5, since the frequency-divided clock signal div.CLK1 is not output, the UP1 signal continues being output from the first PFD 11 and, at the same time, the DN2 signal continues being output from the second PFD 16. At this point, an amount of the current flowing in through the N-type MOSFET 12C corresponding to the UP1 signal is larger by "n" times than that of the current flowing out through the P-type MOSFET 12A corresponding to the DN2 signal, at the output terminal "e" in the charge pumping circuit 12, the flow-in current assumes a dominant amount in the error signal. Therefore, since a control voltage output from the LPF 13 decreases rapidly and, as a result, the frequency of the output clock signal VCO.CLK output from the VCO 14 is lowered, the first frequency divider 15 becomes operable as a frequency divider and a feedback loop is established which enables the multiple PLL circuit to get out of the deadlock state and, when the frequency of the reference clock signal ref.CLK is restored to its normal level, the multiple PLL circuit returns to its normal operations.

Thus, in the multiple PLL circuit of the first embodiment, since the second PFD 16 and the second frequency divider 17 are added to the conventional multiple PLL circuit provided with the first PFD 11 and first frequency divider 15, even if the multiple PLL circuit falls in the deadlock state due to an abnormal increase in the frequency of the output clock signal VCO.CLK and due to no output of the frequency-divided clock signal div.CLK1 from the first DIV 15, the frequency of the output clock signal CVO.CLK is rapidly lowered and the multiple PLL circuit can get out of the deadlock state.

Second Embodiment

Figure 6:
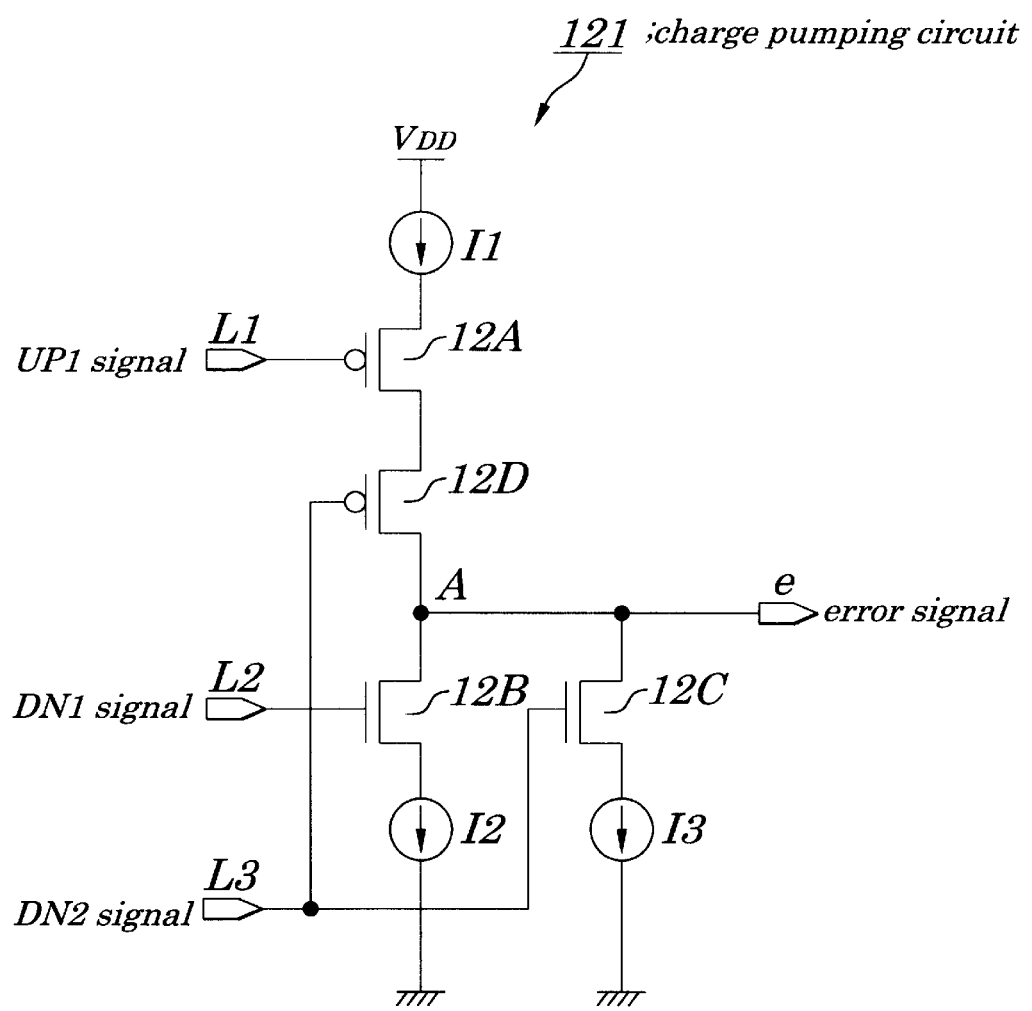
FIG. 6 is a circuit diagram showing configurations of a charge pumping circuit employed in a multiple PLL circuit of a second embodiment of the present invention.

FIG. 6 is a circuit diagram showing configurations of a charge pumping (CP) circuit employed in a multiple PLL circuit of a second embodiment of the present invention. Entire configurations of the multiple PLL circuit of the second embodiment are the same as those of the first embodiment, however, only configurations of the charge pumping circuit are different from those in the first embodiment.

The charge pumping circuit 121 of the second embodiment, as shown in FIG. 6, includes a P-type MOSFET 12A, N-type MOSFET 12B, N-type MOSFET 12C, and P-type MOSFET 12D.

The P-type MOSFET 12A, when a UP1 signal being a downward pulse is fed to an input terminal L1, is turned ON, causing a current to be determined by a current source I1 to flow out from a power source $V_{DD}$, through an output terminal "e". The N-type MOSFET 12B, when a DN1 signal being an upward pulse is fed to an input terminal L2, is turned ON, causing a current to be determined by a current source I2 to flow through the terminal "e" in a ground. Moreover, the N-type MOSFET 12C, when a DN2 signal being an upward pulse is fed to an input terminal L3, is turned ON, causing a current to be determined by a current source I3 to flow through the output terminal "e" to a ground. A value of the current flowing through the current source I1 is equal to a value of the current flowing through the current source I2 and a value of currents flowing through the current source I3 is larger by "n" times than that of currents flowing through the current source I2.

The configurations of the charge pumping circuit 121 described above are the same as those of a charge pumping circuit 12 of the first embodiment shown in FIG. 2. However, in the charge pumping circuit 121 of the second embodiment, a P-type MOSFET 12D is additionally connected between the P-type MOSFET 12A connected to the power source VDD and a connection point A existing between the output terminal "e" and the N-type MOSFET 12B.

Next, operations of the charge pumping circuit 121 of the second embodiment will be explained below. When the N-type MOSFET 12C is turned ON by the DN2 signal output from a second PFD 16 (FIG. 1), since the P-type MOSFET 12D is turned OFF, a path leading from the power source $V_{DD}$ through the P-type MOSFET 12A to the connection point A is interrupted. In the case of the charge pumping circuit 12 shown in FIG. 2, if the multiple PLL circuit falls into a deadlock state, as shown in FIG. 2, since both the UP1 signal output from a first PFD 11 (FIG. 1) and the DN2 signal output from the second PFD 16 are output at the same time, a lead-through current flows in a path leading from the power source $V_{DD}$ through the P-type MOSFET 12A and N-type MOSFET 12C to a ground. However, in the case of the charge pumping circuit 121 of the second embodiment, even when the multiple PLL circuit falls into the deadlock state, since the P-type MOSFET 12D is turned OFF, a lead-through current flowing from the power source VDD to the ground is not generated.

Thus, in the multiple PLL circuit of the second embodiment, the P-type MOSFET 12D which is turned OFF when the multiple PLL circuit falls into the deadlock state, is connected in series to the P-type MOSFET 12A adapted to cause a current to flow out from the power source $V_{DD}$ to the output terminal "e" and therefore no lead-through current flowing from the power source $V_{DD}$ to the ground is generated even during a period in the deadlock state and, as a result, current consumption in the charge pumping circuit 121 can be reduced and the circuit elements can be protected.

Next, operations of the multiple PLL circuit to be performed when the frequency division rate of a second DIV 17 is one will be explained.

The operations of the multiple PLL circuit shown in FIG. 1 to be performed when there is no second DIV 17 are different depending on whether a frequency of the frequency-divided clock signal div.CLK output from a first DIV 15 is higher or lower than that of a reference clock signal ref.CLK. If the frequency of a frequency-divided clock signal div.CLK1 is higher than that of the reference clock signal ref.CLK, the DN1 signal is output from the first PFD 11. On the other hand, though a UP2 signal is output from the first PFD 16, the UP2 signal does not exert an influence on operations of the multiple PLL circuit. Therefore, the charge pumping circuit 12, since only the DN1 signal is input therein, operates so as to lower a control voltage to be fed to a VCO 14 and, as a result, the frequency of an output clock signal VCO.CLK output from the VCO 14 is lowered and the frequency of the frequency-divided clock signal div.CLK1 is also lowered rapidly, which causes the frequency of the frequency-divided clock signal div. CLK1 to match the frequency of the reference clock signal ref.CLK.

On the other hand, if the frequency of the frequency-divided clock signal div.CLK1 is lower than that of the reference clock signal ref.CLK, the UP1 signal is output from the first PFD 11. The DN2 signal is also output from the second PFD 16. In this state, at the output terminal "e" of the charge pumping circuit 12 occur an flow-out current based on the UP1 signal and an flow-in current based on the DN2 signal, however, since an amount of the flow-in current based on the DN2 signal is larger than that of the flow-out current based on the UP1 signal, the CP circuit 12 operates so as to lower the control voltage to be fed to the VCO 14 as a whole. As a result, since the frequency of the output clock signal VCO.CLK of the VCO 14 is lowered and then the frequency of the frequency-divided clock signal div. CLK is also lowered, an abnormal operation state occurs in which the frequency-divided signal div.CLK is not in synchronization with the reference clock signal ref.CLK.

Thus, in the multiple PLL circuit shown in FIG. 1, if the second DIV 17 is not provided, fully stable operations cannot be implemented, however, by mounting an appropriate additional circuit, it is made possible to perform normal operations. An example for the case will be explained below.

Third Embodiment

Figure 7:
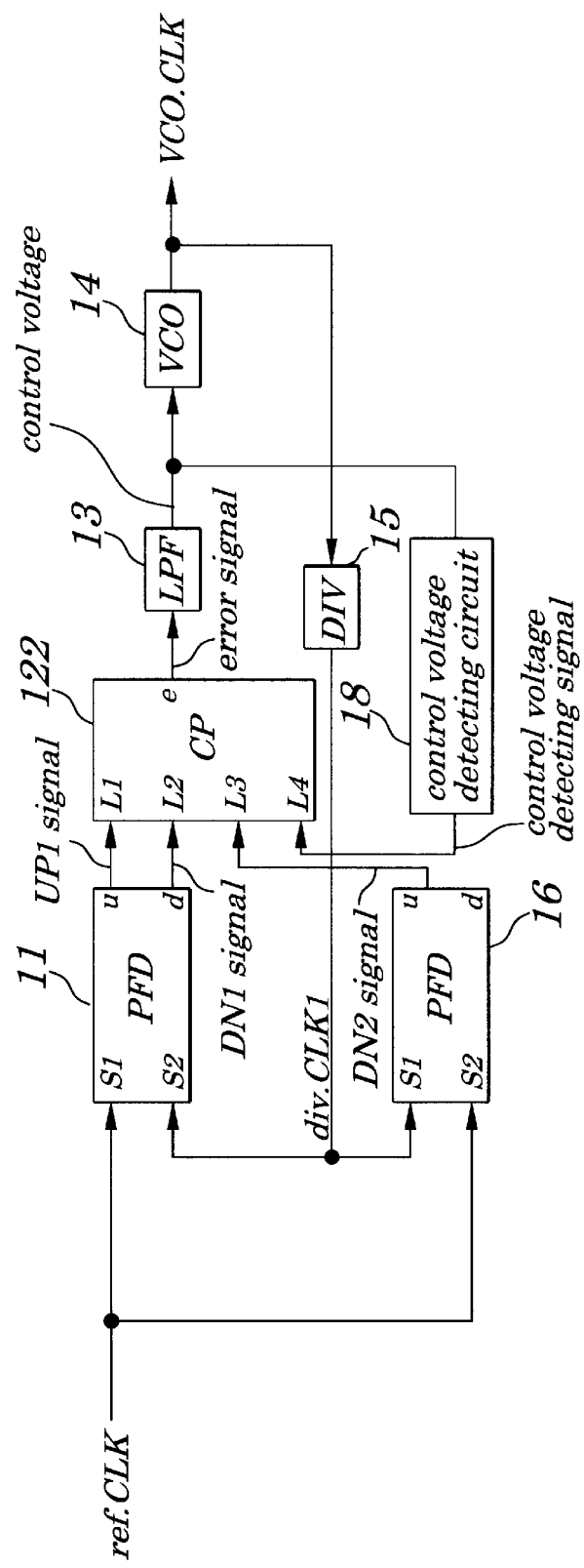
FIG. 7 is a schematic block diagram showing configurations of a multiple PLL circuit according to a third embodiment of the present invention.
Figure 8:
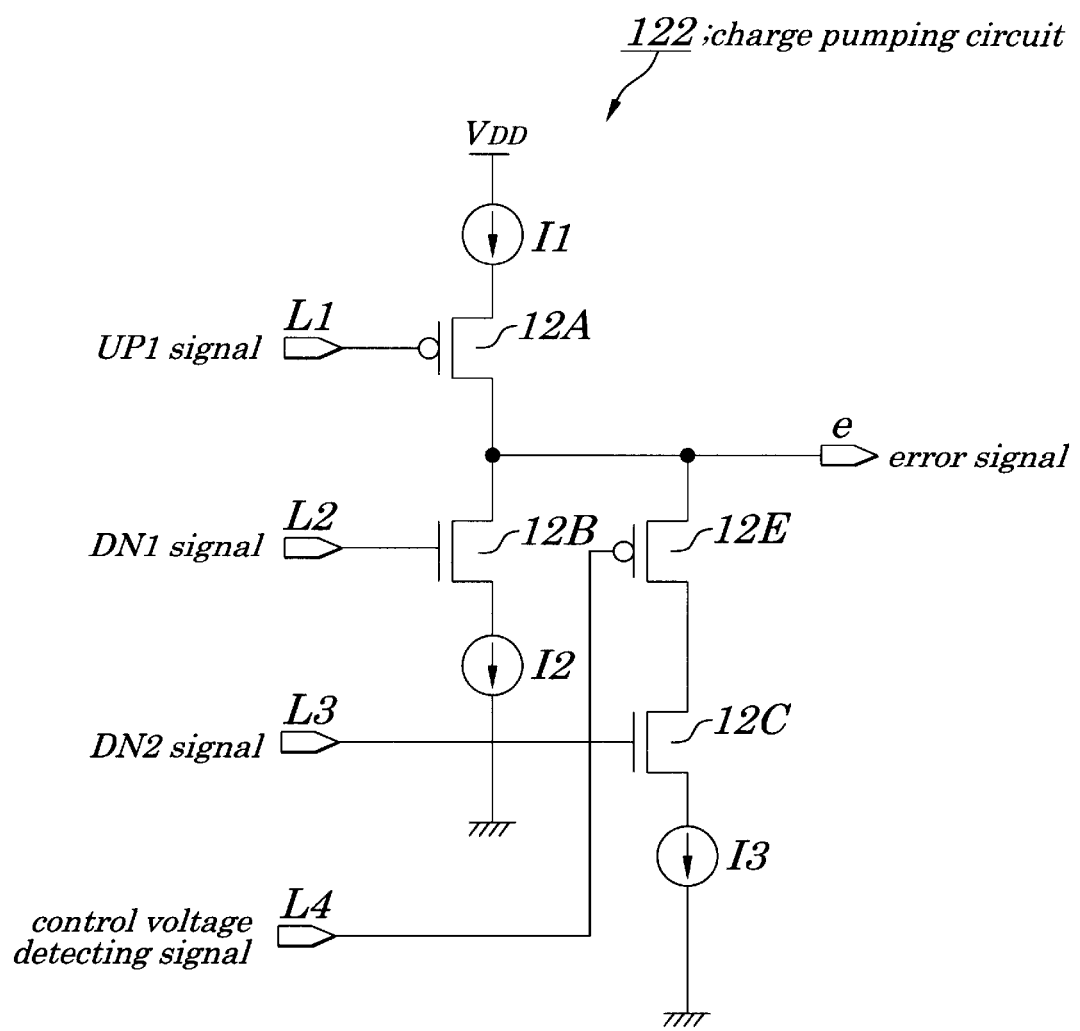
FIG. 8 is a circuit diagram illustrating configurations of a charge pumping circuit employed in the multiple PLL circuit of the third embodiment of the present invention.

FIG. 7 is a schematic block diagram showing configurations of a multiple PLL circuit according to a third embodiment of the present invention. FIG. 8 is a circuit diagram illustrating configurations of a charge pumping circuit 12 employed in the multiple PLL circuit of the third embodiment.

As shown in FIG. 7, the multiple PLL circuit of the third embodiment chiefly includes a first phase/frequency comparator (PFD) 11, a charge pumping circuit 122, a low pass filter (LPF) 13, a voltage controlling oscillator (VCO) 14, a frequency divider (DIV) 15, a second phase/frequency comparator (PFD) 16, and a control voltage detecting circuit 18.

Configurations of the first PFD 11, the LPF 13, the VCO 14, the DIV 15 and the second PFD 16 are the same as those in the first embodiment.

The control voltage detecting circuit 18, when having detected that a control voltage to be fed to the VCO 14 dropped below a specified voltage, makes high a control voltage detecting signal. Operations of the charge pumping circuit 122 are the same as those of the charge pumping circuit 12 in the first embodiment in that the charge pumping circuit 122 generates an error signal so as to have a current flow out from an output terminal "e" by an UP1 signal input to an input terminal L1 and to have a current flow in from the output terminal "e" by a DN1 signal input to an input terminal L2 or a DN2 signal input to an input terminal L3, however, differ from those of the charge pumping circuit 12 in the first embodiment in that the charge pumping circuit 122 operates, when the control signal detecting signal input to an input terminal L4 is asserted, to stop flowing of a current caused by an error signal based on the DN2 signal output from the second PFD 16, in from the output terminal "e".

The charge pumping circuit 122 of the third embodiment, as shown in FIG. 8, includes a P-type MOSFET 12A, an N-type MOSFET 12B, an N-type MOSFET 12C and a P-type MOSFET 12E. In the charge pumping circuit 122 of the embodiment, configurations of the P-type MOSFET 12A, N-type MOSFET 12B, and N-type MOSFET 12C are the same as those in the first embodiment shown in FIG. 2. Also, configurations of current sources I1, I2, and I3 connected respectively to the P-type MOSFET 12A, N-type MOSFET 12B, and N-type MOSFET 12C are also the same as those in the first embodiment shown in FIG. 2. However, configurations of the third embodiment differ from those in the first embodiment in that the P-type MOSFET 12E is intervened between the output terminal "e" and the N-type MOSFET 12C and, when a control voltage detecting signal fed from an outside is low, the output terminal "e" is connected to the N-type MOSFET 12C and, when the control voltage detecting signal is high, the output terminal "e" is disconnected from the N-type MOSFET 12C.

Operations of the multiple PLL circuit of the third embodiment will be explained by referring to FIGS. 7 and 8. In the multiple PLL circuit shown in FIG. 7, if a frequency of a frequency-divided clock signal div.CLK1 is higher than that of a reference clock signal ref.CLK, since the DN1 signal is output from the first PFD 11 and the DN2 signal is not output from the second PFD 16, only the DN1 signal is input to an input terminal L2. As a result, the charge pumping circuit 122 generates a flow-in current, based on the DN1 signal, at the output terminal "e" and operates to lower a control voltage to be fed to the VCO 14. Therefore, control is exerted so as to lower a frequency of an output clock signal VCO.CLK output from the VCO 14 and, as a result, a frequency of a frequency-divided clock signal div.CLK1 is lowered which enables the frequency-divided clock signal div.CLK1 match the frequency of with the reference clock signal ref.CLK.

On the other hand, if a frequency of the frequency-divided clock signal div.CLK1 is lower than that of the reference clock signal ref.CLK, since the UP1 signal is output from the first PFD 11 and the DN2 signal is output from the second PFD 16, the UP1 signal is input to the input terminal L1 in the CP circuit 122 and the DN2 signal is input to the input terminal L3, causing a flow-out current based on the UP1 signal to be produced at the output terminal "e" and a flow-in current based on the DN2 signal to be produced at the output terminal "e". In this case, since an amount of the flow-in current based on the DN2 signal is larger than that of the flow-out current based on the UP1 signal, the charge pumping circuit 122 operates so as to lower the control voltage to be fed to the VCO 14 as a whole and therefore so as to lower a frequency of the output clock signal VCO.CLK output from the VCO 14.

At this point, the control voltage detecting circuit 18, by detecting a drop of the control voltage to be fed to the VCO 14 below a specified lower limit, makes high the control voltage detecting signal input to an input terminal L4 and therefore the P-type MOSFET 12E in the charge pumping circuit 122 is turned OFF, thereby inhibiting the flow-in current based on the DN2 signal at the terminal "e". As a result, the charge pumping circuit 122 operates to increase the control voltage to be fed to the VCO 14 by using only the flow-out current based on the UP1 signal and a frequency of the output clock signal VCO.CLK output from the VCO 14 increases, which makes it possible to prevent the occurrence of abnormal states of the multiple PLL circuit.

In the multiple PLL circuit of the third embodiment, when the PLL circuit falls in a deadlock state due to an abnormal increase in the frequency of the reference clock signal ref.CLK, as in the case of the first embodiment, since the control voltage to be fed to the VCO 14 is higher than the specified lower limit and the control voltage detecting circuit 18 makes high the control voltage detecting signal input to the input terminal L4, the DN2 signal output from the second PFD 16 is output which enables the multiple PLL circuit to be restored from the deadlock state.

Thus, in the multiple PLL circuit of the third embodiment, by detecting the drop of the control voltage to be fed to the VCO 14 and by using the DN2 signal output from the second PDF 16, the flow-in current into the charge pumping circuit 122 is inhibited and therefore even if no frequency divider for the reference clock signal ref.CLK is provided on an input side of the second PFD 16, normal operations can be implemented.

Thus, according to the above embodiments of the present invention, unlike in the case of the conventional multiple PLL circuit in which, by using the first phase/frequency comparator, a phase or a frequency of a reference clock is compared with a phase or a frequency of a first frequency-divided clock obtained by dividing a clock output from a voltage controlling oscillator, and feed-back control to change a control voltage to be fed to the voltage controlling oscillator is exerted by an UP signal or a DN signal generated depending on whether the frequency-divided clock lags or leads the reference clock or whether a frequency of the frequency-divided clock is lower or higher than that of the reference clock and, as a result, the frequency-divided clock is synchronized with the reference clock, in the multiple PLL circuit of the present invention, the second phase/frequency comparator is provided which is used to compare a phase or a frequency of the first frequency-divided clock with a phase or a frequency of the reference clock or with a phase or a frequency of a second frequency-divided clock obtained by dividing the reference clock and, even when the multiple PLL circuit falls in a deadlock state, the first frequency-divided clock is not output and, as a result, the second DN signal is output which decreases the control voltage and lowers the frequency of the clock output from the voltage controlling oscillator and therefore it is made possible for the multiple PLL circuit to reliably get out of the deadlock state without disturbing ordinary operations of the multiple PLL circuit.

It is apparent that the present invention is not limited to the above embodiments but may be changed and modified without departing from the scope and spirit of the invention. For example, the control voltage detecting circuit 18 of the third embodiment may be so configured that it performs a hysteresis operation which causes the control voltage detecting signal to go high when a control voltage has dropped below a first specified voltage level, however, when the control voltage has risen to its original level, does not cause the control voltage detecting signal to go low but keeps the control voltage detecting signal still in the high state and further does not cause the control voltage detecting signal to go low until the control voltage exceeds a second specified voltage level being higher than the first specified voltage level and further keeps the control voltage detecting signal in the low state until the control voltage again drops and reaches the first specified voltage level. By having the control voltage detecting circuit 18 operate as above, it is made possible to stabilize, based on detection of the control voltage, the control on outputting of an error signal from the charge pumping circuit 122. Moreover, in the charge pumping circuit 122, as in the case of the second embodiment, a P-type MOSFET 12E may be provided which is connected in series to the P-type MOSFET 12A and which is turned OFF at a time of occurrence of a deadlock state. By configuring so, the occurrence of a through-current flowing from a power source VDD into a ground is inhibited, which enables reduction of current consumption in the charge pumping circuit 122 and protection of circuit elements.

What is claimed is:

1. A multiple phase-locked loop circuit comprising:
a first phase/frequency comparing unit to compare a phase or a frequency of a reference clock with a phase or a frequency of a first frequency-divided clock and to output an UP signal or a first DN signal depending on whether said first frequency-divided clock lags or leads said reference clock or whether a frequency of said first frequency-divided clock s lower or higher than that of said reference clock;

a charge pumping unit to generate an error signal by causing a current to flow out, in response to said UP signal, and by causing a current to flow in, in response to said first DN signal;

a low pass filter to smooth said error signal and to output said smoothed error signal as a control voltage;

a voltage control oscillating unit to generate an output clock whose frequency changes to be high or low depending on whether said control voltage is high or low;

a first frequency-divided unit to output said first frequency-divided clock obtained by dividing said frequency of said output clock at a specified frequency division rate;

a second phase/frequency comparing unit to compare a phase or a frequency of said first frequency-divided clock with a phase or a frequency of said reference clock or of a clock having a frequency being lower than that of said reference clock and, when said first frequency-divided clock lags said frequency clock or said clock having said frequency being lower than that of said reference clock or a frequency of said first frequency-divided clock is lower than that of said reference clock or of said clock having said frequency being lower than that of said reference clock, to output a second DN signal; and wherein said multiple phase-locked loop circuit is able to get out of a deadlock state by using said second DN signal.

2. The multiple phase-locked loop circuit according to claim 1, further comprising a second frequency-dividing unit to output a second frequency-divided clock obtained by dividing said reference clock at a specified frequency division rate and wherein said second phase/frequency comparing unit compares a phase of said first frequency-divided clock with a phase of said second frequency-divided clock and, when a frequency of said first frequency-divided clock is lower than that of said second frequency-divided clock, outputs said second DN signal.

3. The multiple phase-locked loop circuit according to claim 1, wherein said charge pumping unit is so configured so as to stop, when said second DN signal is output, a current flowing out in response to said UP signal.

4. The multiple phase-locked loop circuit according to claim 1, wherein said low pass filter is so configured that a serial circuit made up of a resistor and a first capacitor both being connected between a terminal for receiving said error signal and a ground and a second capacitor being also connected to a ground are connected in parallel between said terminal for receiving said error signal and a terminal for outputting said control voltage.

5. A multiple phase-locked loop circuit comprising:

a first phase/frequency comparing unit to compare a phase or a frequency of a reference clock with a phase or a frequency of a first frequency-divided clock and to output an UP signal or a first DN signal depending on whether said first frequency-divided clock lags or leads said reference clock or whether a frequency of said first frequency-divided clock is lower or higher than that of said reference clock;

a second phase/frequency comparing unit to compare a phase or a frequency of said first frequency-divided clock with a phase or a frequency of a second frequency-divided clock and, when said first frequency-divided clock lags said second frequency-divided clock or when a frequency of said first frequency-divided clock is lower than that of said second frequency-divided clock, to output a second DN signal;

a charge pumping unit to generate an error signal by causing a current to flow out in response to said UP signal, by causing a same amount of currents as that of said current flowing out in response to said UP signal to flow out in response to said first DN signal and by causing an amount of currents being greater than that of said current flowing in response to said UP signal or in response to said first DN signal to flow in, in response to said second DN signal;

a low pass filter to smooth said error signal and to output said smoothed error signal as a control voltage;

a voltage control oscillating unit to generate an output clock whose frequency changes to be high or low depending on whether said control voltage is high or low;

a first frequency-divided unit to output said first frequency-divided clock obtained by dividing said frequency of said output clock at a specified frequency division rate; and a second frequency-divided unit to output said second frequency-divided clock obtained by dividing said frequency of said reference clock at a specified frequency division rate.

6. The multiple phase-locked loop circuit according to claim 5, wherein said charge pumping unit is so configured so as to stop, when said second DN signal is output, a current flowing out in response to said UP signal.

7. The multiple phase-locked loop circuit according to claim 5, wherein said low pass filter is so configured that a serial circuit made up of a resistor and a first capacitor both being connected between a terminal for receiving said error signal and a ground and a second capacitor being also connected to a ground are connected in parallel between said terminal for receiving said error signal and a terminal for outputting said control voltage.

8. A multiple phase-locked loop circuit comprising:

a first phase/frequency comparing unit to compare a phase or a frequency of a reference clock with a phase or a frequency of a frequency-divided clock and to output an UP signal or a first DN signal depending on whether a first frequency-divided clock lags or leads said reference clock or whether a frequency of said first frequency-divided clock is lower or higher than that of said reference clock;

a second phase/frequency comparing unit to compare a phase or a frequency of said first frequency-divided clock with a phase or a frequency of a reference clock and, when said first frequency-divided clock lags said first reference clock or when a frequency of said frequency-divided clock is lower than that of said reference clock, to output a second DN signal;

a charge pumping unit to generate an error signal by causing a current to flow out in response to said UP signal, by causing a same amount of currents as that of said current flowing out in response to said UP signal to flow in, in response to said first DN signal and by causing an amount of currents being greater than that of currents flowing in response to said UP signal or in response to said first DN signal to flow in, in response to said second DN signal and to stop said current flowing in based on said second DN signal, in response to a control voltage detecting signal;

a low pass filter to smooth said error signal and to output said smoothed error signal as a control signal;

a voltage control oscillating unit to generate an output clock whose frequency changes to be high or low depending on whether said control signal voltage is high or low;

a frequency-divided unit to output said first frequency-divided clock obtained by dividing said frequency of said output clock at a specified frequency division rate; and a control voltage detecting unit to output said control voltage detecting signal when said control signal drops below a specified voltage level.

9. The multiple phase-locked loop circuit according to claim 8, wherein said control voltage detecting unit performs a hysteresis operation which outputs said control voltage detecting signal when said control signal has dropped below said specified voltage level and thereafter keeps a state of outputting said control voltage detecting signal and which stops outputting of said control signal detecting signal when said control signal has risen and exceeded a second specified voltage level.

10. The multiple phase-locked loop circuit according to claim 8, wherein said charge pumping unit is so configured so as to stop, when said second DN signal is output, a current flowing out in response to said UP signal.

11. The multiple phase-locked loop circuit according to claim 8, wherein said low pass filter is so configured that a serial circuit comprising resistor and a first capacitor both being connected between a terminal for receiving said error signal and a ground and a second capacitor being also connected to a ground are connected in parallel between said terminal for receiving said error signal and a terminal for outputting said control signal.

* * * * *